United States Patent
Tanaka et al.

(10) Patent No.: US 6,828,165 B2
(45) Date of Patent: Dec. 7, 2004

(54) SEMICONDUCTOR PLASMA PROCESSING APPARATUS WITH FIRST AND SECOND PROCESSING STATE MONITORING UNITS

(75) Inventors: Junichi Tanaka, Tsuchiura (JP); Hiroyuki Kitsunai, Chiyoda (JP); Akira Kagoshima, Kudamatsu (JP); Daisuke Shiraishi, Kudamatsu (JP); Hideyuki Yamamoto, Kudamatsu (JP); Shoji Ikuhara, Hikari (JP); Toshio Masuda, Toride (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/438,842

(22) Filed: May 16, 2003

(65) Prior Publication Data

US 2003/0199108 A1 Oct. 23, 2003

Related U.S. Application Data

(60) Continuation of application No. 10/196,208, filed on Jul. 17, 2002, now Pat. No. 6,706,543, which is a division of application No. 09/946,732, filed on Sep. 6, 2001, now Pat. No. 6,616,759.

(51) Int. Cl.[7] .............................................. H01L 21/66
(52) U.S. Cl. .................................................... 438/14
(58) Field of Search ............................................ 438/14

(56) References Cited

U.S. PATENT DOCUMENTS

| | | | |
|---|---|---|---|
| 5,658,423 A | 8/1997 | Angell et al. | |
| 5,864,773 A | 1/1999 | Barna et al. | |
| 6,110,214 A | 8/2000 | Klimasauskas | |
| 6,238,937 B1 | 5/2001 | Toprac et al. | |
| 6,246,972 B1 | 6/2001 | Klimasauskas | |
| 6,303,395 B1 * | 10/2001 | Nulman .................... | 438/14 |
| 6,373,033 B1 | 4/2002 | de Waard et al. | |
| 6,465,263 B1 | 10/2002 | Coss | |

FOREIGN PATENT DOCUMENTS

| | | |
|---|---|---|
| JP | 10-125660 | 5/1998 |
| JP | 11-87323 | 3/1999 |

* cited by examiner

Primary Examiner—John F. Niebling
Assistant Examiner—Andre' C. Stevenson
(74) Attorney, Agent, or Firm—Antonelli, Terry, Stout & Kraus, LLP

(57) ABSTRACT

A semiconductor plasma processing apparatus for processing a semiconductor wafer includes a sensor for monitoring at least one processing state of the semiconductor plasma processing apparatus, first and second processing state monitoring units coupled to the sensor, and a selector unit for selecting one of the first and second processing state monitoring units.

3 Claims, 8 Drawing Sheets

|  | PROCESSING CONDITION 1 (FLOW RATE OF GAS A) | PROCESSING CONDITION 2 (WAFER BIAS POWER) |
|---|---|---|
| CENTRAL CONDITION | 500sccm | 50W |
| EXPERIMENTAL CONDITION 1 | 520sccm | 60W |
| EXPERIMENTAL CONDITION 2 | 520sccm | 60W |
| EXPERIMENTAL CONDITION 3 | 480sccm | 40W |
| EXPERIMENTAL CONDITION 4 | 480sccm | 40W |

SEMICONDUCTOR PLASMA PROCESSING APPARATUS WITH FIRST AND SECOND PROCESSING STATE MONITORING UNITS

CROSS REFERENCE TO RELATED APPLICATION

This is a continuation of U.S. application Ser. No. 10/196,208, filed Jul. 17, 2002, now U.S. Pat. No. 6,706,543, which is a divisional of U.S. application Ser. No. 09/946,732, filed Sep. 6, 2001, now U.S. Pat. No. 6,616,759, the subject matter of which is incorporated by reference herein.

BACKGROUND OF THE INVENTION

The present invention relates to a semiconductor processing apparatus, and more particularly, to a semiconductor processing apparatus which predicts processing results to improve the operating rate and reliability of the apparatus and a method of monitoring and/or controlling the semiconductor processing apparatus.

In recent years, the dimensions of semiconductor devices have been miniaturized more and more, so that a severe manufacturing dimension accuracy is required to such an extent that a gate electrode of 0.1 $\mu$m or smaller should be processed in a dimensional accuracy of 10% or less. On the other hand, in a semiconductor manufacturing apparatus for processing a semiconductor wafer using heat and plasma and reaction products, resulting from chemical reactions within the apparatus, are attached and remain on inner walls of the apparatus. Such reaction products change a wafer processing state in the apparatus over time. For this reason, as a number of wafers are sequentially processed by the semiconductor manufacturing apparatus, the shape of semiconductor devices on wafers gradually changes to cause deteriorated performance. To accommodate this problem, generally, various countermeasures have been taken. For example, the inner walls of the chamber are cleaned using plasma to remove products attached thereon, or the walls of the chamber are heated so that products are less likely to adhere on the inner walls. However, in most cases, such countermeasures are not perfect, inevitably resulting in a gradual change in the shape of processed semiconductor devices. For this reason, the manufacturing apparatus must undergo replacement of parts and wet cleaning before the shape of processed devices changes so as to cause a problem. In addition, fluctuations in a variety of states of the apparatus involve in variations in the shape of devices processed on wafers, other than deposited films. To address these problems, there have been created techniques for detecting a change in a processing state within a semiconductor manufacturing apparatus and feeding back the result of detection to the input of the semiconductor manufacturing apparatus to maintain the processing state constant.

Such a method of monitoring fluctuations in plasma processing is disclosed, for example, in JP-A10-125660.This official document shows a method of predicting the performance of an apparatus and diagnosing the state of plasma using an equation representing the relationship between plasma processing characteristics and electric signals generated in the apparatus. Specifically, JP-A-10-125660 discloses a method of deriving an approximate expression which represents the relationship between three electric signals and the plasma processing characteristics of the apparatus through multiple regression. Another example is disclosed in JP-A-11-87323. A method disclosed in JP-A-11-87323 adapts a general detection system having a multiplicity of existing detectors mounted thereon to a semiconductor manufacturing apparatus to monitor the state of the apparatus from a correlation signal of signals detected by the detectors. Specifically, the correlation signal is generated by a calculation based on the ratio of six electric signals. A further example is disclosed in U.S. Pat. No. 5,658,423. This U.S. patent discloses a method of monitoring the state of an apparatus by capturing a number of signals from a light and a mass analyzer to generate a correlation signal for monitoring. The correlation signal is generated using a principal component analysis.

SUMMARY OF THE INVENTION

However, the method disclosed in JP-A-10-125660 fails to perform a successful prediction using the multiple regression when there are a large number of sensor data for monitoring the apparatus since explanatory variables include a large number of signals which are not related to the processing performance intended for the prediction. The method disclosed in JP-A-11-87323 in turn is a general method which performs the diagnosis using a signal correlated to a multiplicity of detected signals from a multiplicity of known detecting means, wherein the correlation is established by taking the ratio of several signals, just as conventional approaches. This method, therefore, would encounters difficulties in applying to a specific system for accurately monitoring the state of a semiconductor manufacturing apparatus which can take a variety of states depending on a large number of causes for fluctuations. Unlike the foregoing methods, U.S. Pat. No. 5,658,423 discloses a method of monitoring the state of plasma by analyzing a principal component of a large amount of data monitored from an apparatus to capture fluctuations in the state of the apparatus. However, semiconductor manufacturing apparatus for use in actual mass production would not work well only with a concept of adapting a general statistic processing method as disclosed. For example, it is unknown in most cases how a change in the principal component will cause what kind of result in the processing.

It is an object of the present invention to provide a semiconductor processing apparatus and method which monitor a processing state to detect faulty processing or predict processing results based on a monitored output to improve the operating rate and reliability of the semiconductor processing apparatus for processing a variety of types of devices.

According to an aspect of the present invention, a semiconductor device processing apparatus includes a sensor for monitoring a processing state of the semiconductor processing apparatus, processing result input means for inputting measured values for processing results of a semiconductor wafer processed by the semiconductor processing apparatus, a model equation generation unit relying on sensed data acquired by the sensor and the measured values to generate a model equation for predicting a processing result using the sensed data as an explanatory variable, a processing result prediction unit for predicting a processing result based on the model equation and the sensed data, and a process recipe control unit for comparing the predicted processing result with a previously set value to control a processing condition of the semiconductor processing apparatus such that a deviation between the predicted processing result and the previously set value is corrected.

With the foregoing configuration, according to the present invention, monitored data is acquired by the sensor from the semiconductor processing apparatus to generate a model equation which is used to predict processing results before measuring processing results of samples or without measuring the processing results, thereby improving the operating rate and reliability of the semiconductor processing apparatus.

DETAILED DESCRIPTION OF THE EMBODIMENTS

In the following, one embodiment of the present invention will be described with reference to the accompanying drawings.

Figure 1A:
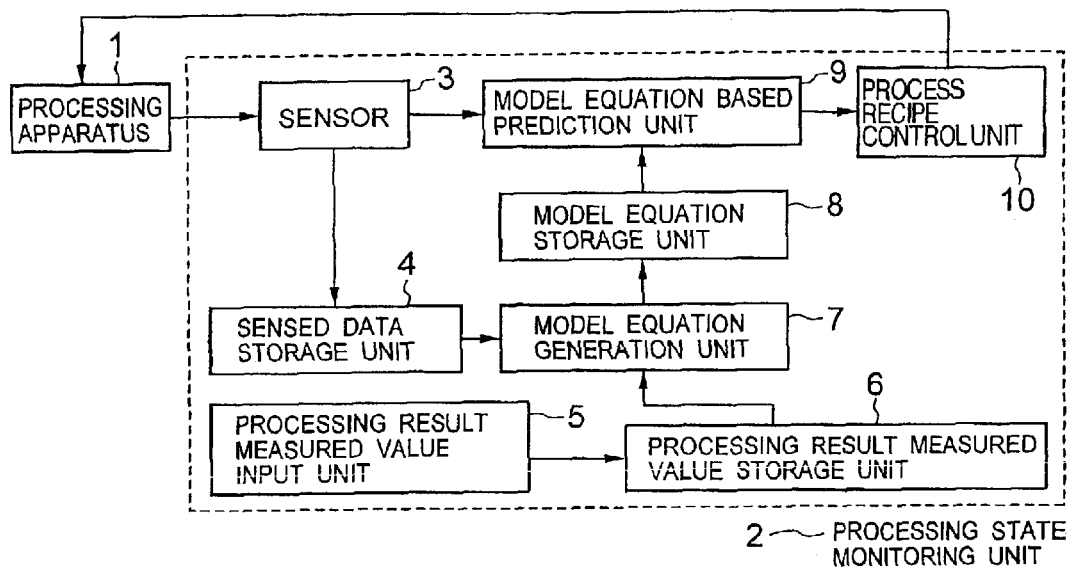
FIG. 1A is a block diagram of a system for controlling a semiconductor device processing apparatus illustrating one embodiment of the present invention.
Figure 1B:
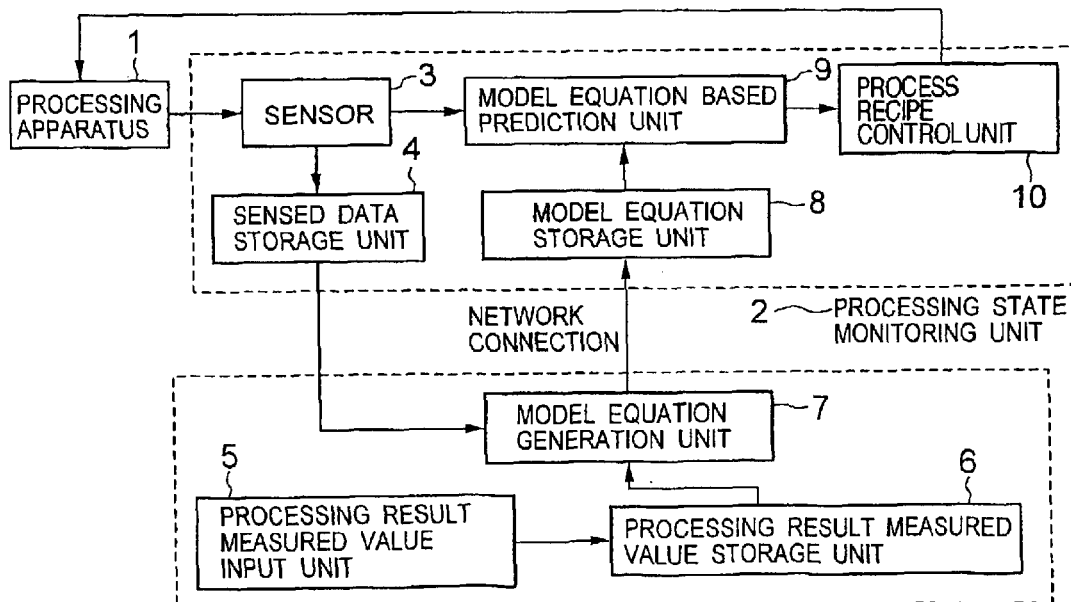
FIG. 1B is a block diagram illustrating an exemplary modification to the control system of FIG. 1A.

FIG. 1A illustrates a first embodiment of the present invention. In FIG. 1A, a processing apparatus 1 is equipped with a processing state monitoring unit 2. The processing state monitoring unit 2 may be incorporated in the apparatus 1, or installed external to the apparatus 1. Alternatively, as illustrated in FIG. 1B, the processing state monitoring unit 2 may be installed at a remote location through a network or the like. Further alternatively, as illustrated in FIG. 1B, a portion of its functions may be separated through a network or the like. Specifically, the processing state monitoring unit 2 has the following configuration. First, the processing state monitoring unit 2 has a sensor unit 3 for monitoring a processing state in the processing apparatus 1 involved in the processing of a wafer. The sensor unit 3 is generally comprised of several types of sensors. For example, for plasma processing in a plasma etching apparatus, a plasma CVD apparatus and so on, the sensor unit 3 acquires the intensity of emitted light at each wavelength in a plasma during processing, spectrally resolved using a spectrometer. For example, when using a spectrometer having 1,000 channels of CCD array, 1,000 sets of sensed data can be acquired in each sampling. In addition, the pressure, temperature, gas flow rate, and so on of the apparatus may also be used as sensed data. Also, results of electrical measurements made on electric current, voltage, impedance, and harmonic components thereof may be used as sensed data. During the processing of a wafer, these sensed data are acquired at proper time intervals. The acquired sensed data are preserved in a sensed data storage unit 4. A processed wafer undergoes measurements of processing results using a processing result measuring device external to or incorporated in the apparatus 1. The measurements of processing results may involve a measurement of CMOS gate width using CDSEM; a measurement of a processed shape such as a cross-sectional shape using a cross-section SEM; or a measurement of electrical characteristics of a processed device. Generally, however, such processing need not be performed on all wafers, but generally, some of wafers may only be extracted for the measurements of the processing results. The processing state monitoring unit 2 has a processing result measured value input unit 5 for receiving measured values of the processing results. The input unit 5 may be a reader for reading information recorded on a portable medium such as a floppy disk, CD-ROM and so on, or a wired or a wireless network connection device. The measured values of processing results received from the input device 5 are preserved in a processing result measured value storage unit 6. The storage unit 6 preserves measured values of processing results for each of a variety of devices. A model equation generation unit 7 fetches, from the sensed data storage unit 4 and the processing result measured value storage unit 6, those samples of the same types of devices, for which both sensed data and measured values of processing results have been preserved therein. When the number of samples is, for example, three or more, the model equation generation unit 7 generates a model equation for predicting measured values of processing results using the sensed data as explanatory variables. In this event, generally, it is difficult to automatically select sensed data for use in the prediction due to a large number and a variety of types of sensed data acquired in the measurements. Particularly, when a variety of devices are processed, data effective for the prediction differs from one device to another, causing it difficult to previously determine sensors for use in the prediction.

Figures 5A, 5B:
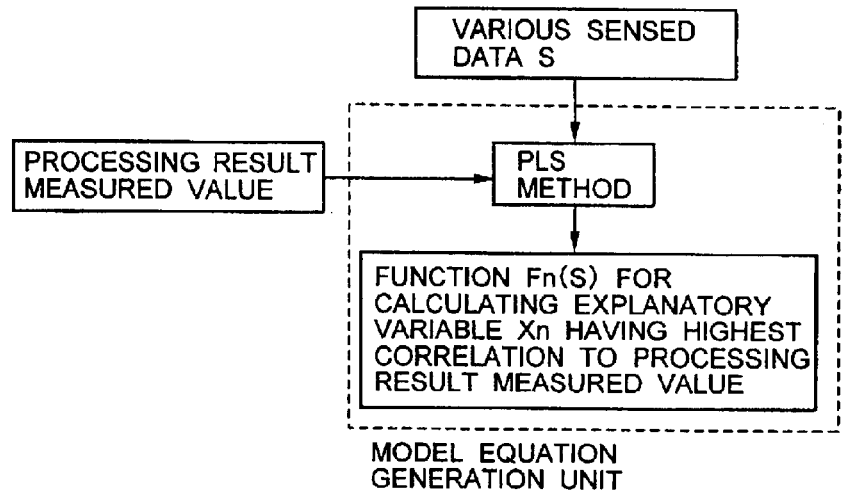
FIG. 5A is a flow chart for explaining the operation of a model generation unit.
FIG. 5B is a table illustrating a method of predicting measured values for processing results of n wafers.

FIG. 5A is a diagram for explaining model equation generation processing based on a PLS (Partial Least Square) method. As illustrated in FIG. 5A, the PLS method automatically generates from a large number of sensed data an explanatory variable which has the highest correlation to fluctuations in data to be predicted. Simultaneously, a function for calculating the explanatory variable can be derived from the sensed data. Assume for example that measured values for processing results of n wafers are intended for the prediction, and Yi represents a measured value for the processing result of an i-th wafer. When m sensed data are acquired from one wafer, Sij indicates a j-th sensed data on the i-th wafer. The m sensed data may be data taken at different times from the same sensor or taken at the same time from the different sensors. FIG. 5B is a diagram for explaining the sensed data Sij. As shown in FIG. 5B, when the processing performed by the apparatus 1 on a single wafer is divided into three steps with different processing conditions, and three sensors A, B, C are used, Sij may be taken in a range of S11 to Sn9 as shown. Sij may be an average value of sensed data in each step of the processing, or in some cases, may be rather converted values from sensed data such as a squared or an inverted version of the sensed data. With the use of the PLS method, the sensed data Sij can be converted into m explanatory variables Xik which is arranged in the order of the magnitude of correlation to fluctuations in the processing result measured value Yi. A function Fk for converting the sensed data Sij into the explanatory variables Xk is expressed by the following Equation (1):

$$Xik = Fk(Si1, Si2, \ldots, Sim) \tag{1}$$

Some of the explanatory variable Xik are relied on to predict processing result measured values. Generally, since an explanatory variable Xi1 has the highest correlation to a processing result measured value Yi, Xi1, Xi2, Xi3 and so on are selected as explanatory variables. In the PLS method, a prediction equation such as the following Equation (2) is generated simultaneously. However, it may be better case by case to create the prediction Equation (2) using explanatory variables such as Xi1 mentioned above.

$$Yi = p(Xi1, Xi2, Xi3) \tag{2}$$

Figure 6:
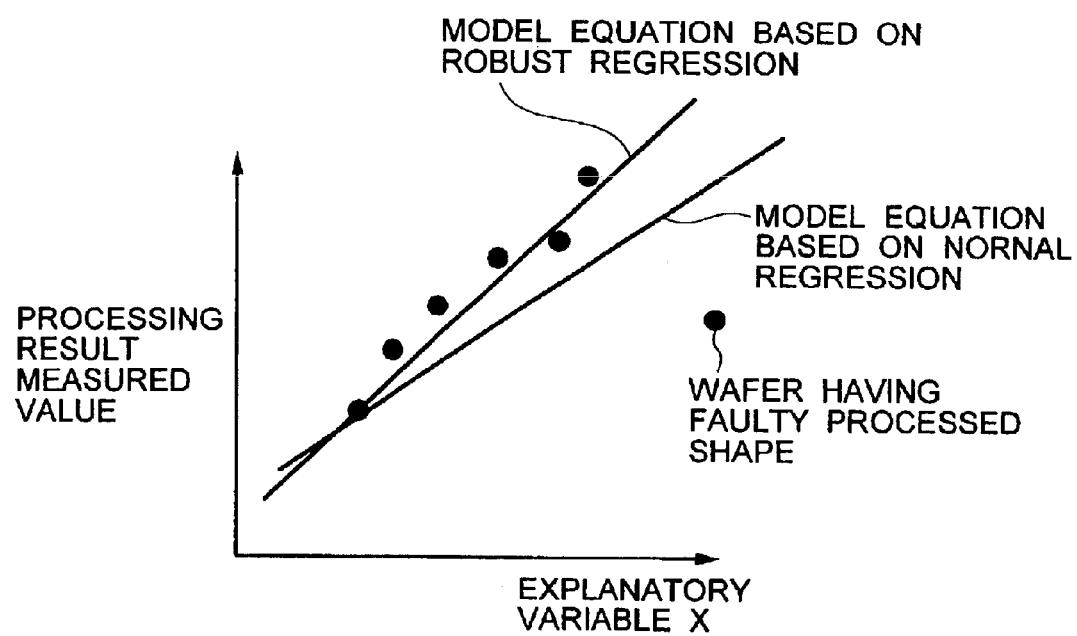
FIG. 6 is a graph for explaining a robust regression analysis.

On the other hand, the processing result measured values may include data of wafers which indicate bad wafer processing states and therefore abnormal processing result measured values. A prediction performed using normal multiple regression for such data would result in generation of a model equation which has a low prediction accuracy due to the influence of abnormal data, as shown in FIG. 6. To avoid such low prediction accuracy, robust regression may be used for the prediction. With the use of the robust regression, a correct prediction model equation can be generated because abnormal data as shown in FIG. 6 are removed from data intended for prediction as outlier.

Figure 7:
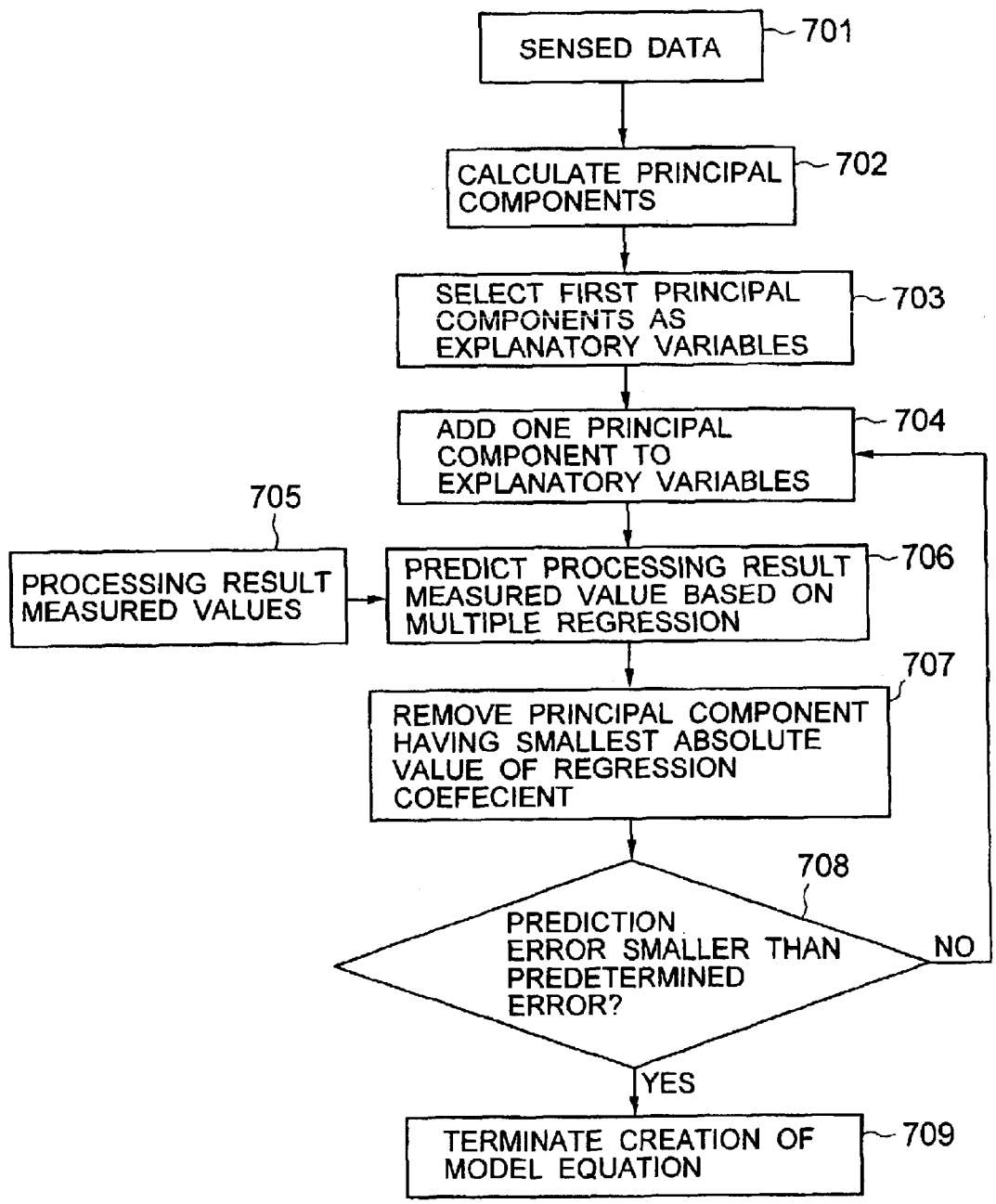
FIG. 7 is a flow chart illustrating a routine for creating a model equation.

FIG. 7 illustrates a flow chart for explaining the model equation creation processing performed by the model equation generation unit 7.

When there are a large number of types of sensed data, the model equation generation unit 7 analyzes principal components of the sensed data (steps 701, 702), and performs the robust regression using the resultant principal components to predict processing results (steps 705–706). In this event, since explanatory variables include principal components which are not required for the prediction of processing results, so that principal components with a smallest regression coefficient is removed from the explanatory variable (step 707), one more principal component is added to the explanatory variables (step 704), and the multiple regression is again performed (step 706), as illustrated in the flow chart. This loop of processing is repeatedly executed until a prediction error is reduced below a predetermined value (step 708). These regression analyses may be linear, or non-linear regression analysis may be used as derived from physical characteristics and experimental values of the processing.

The model equation generated by the method as described above is preserved in a model equation storage unit 8 in FIG. 1. Since the model equation is generated for each of various types of devices, a number of model equations equal to the number of types of devices processed by the processing apparatus 1 are preserved in the model equation storage 8. When a wafer of a certain device is loaded into the processing apparatus 1 for processing, a model equation corresponding to this device is loaded into a prediction unit 9. Signals generated from the sensor unit 3 during the processing of the device are converted to explanatory variables using the equation (1) derived from the PLS method, if required, or converted to principal components through the principal component analysis, and predicted values for processing results are calculated by the model equation expressed by the equation (2). The calculated predicted values are passed to a process recipe control unit 10 which changes processing conditions to correct a deviation of the predicted values from set values for the processing results.

Figures 8, 9:
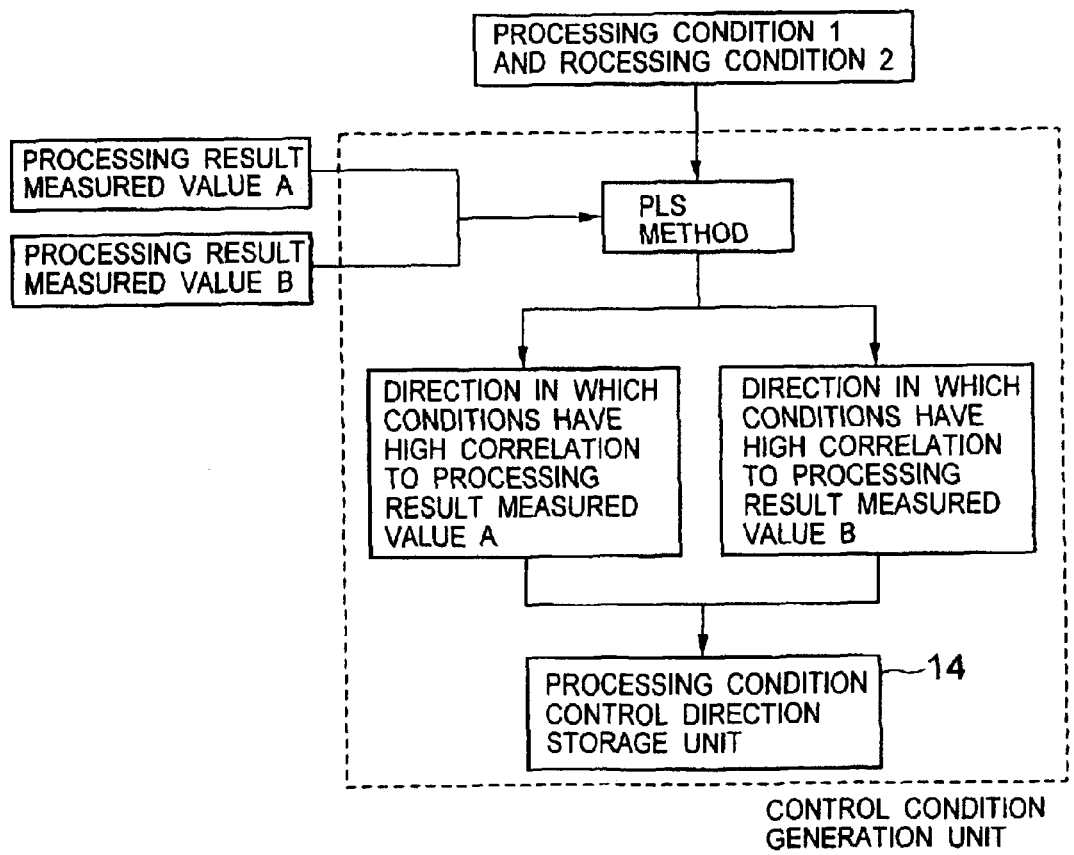
FIG. 8 is a table for explaining a correction operation of a process recipe control unit.
FIG. 9 is a flow chart for explaining the operation of the processing condition generation unit.
Figure 10:
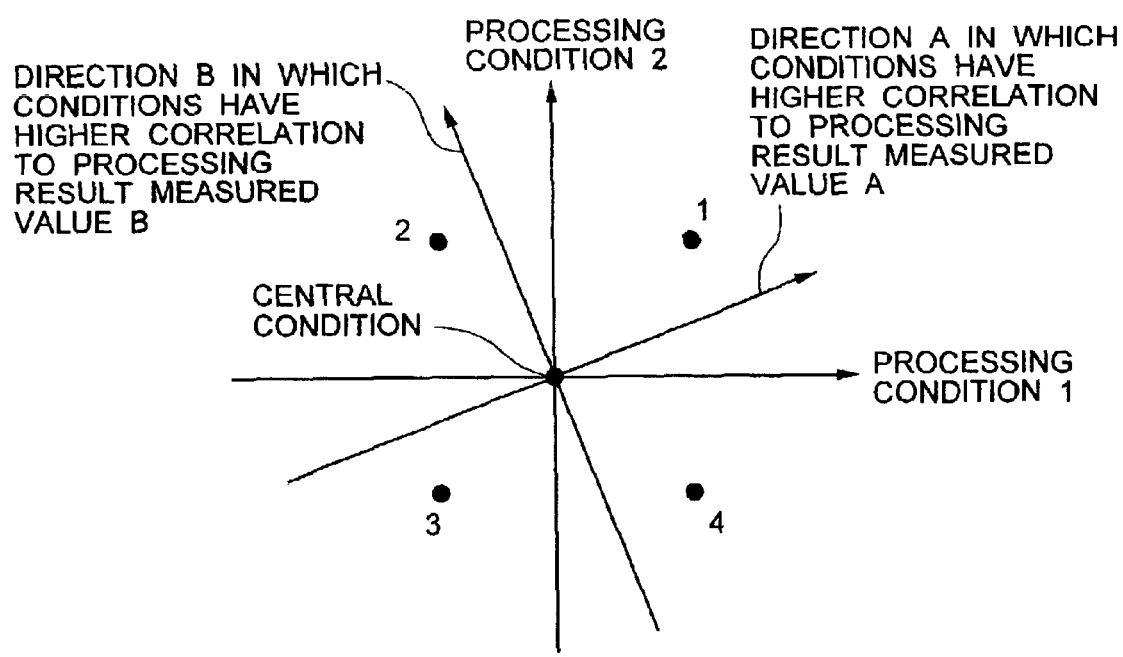
FIG. 10 is a diagram for explaining directions of control for processing conditions.

Next, a specific method will be described for correcting processing conditions in the process recipe control unit 10. Here, the PLS method is used again. In normal processing of semiconductor devices, several conflicting processing performances may often be required as requirements for the processing. For example, etching of a gate electrode or the like requires the verticality of side walls of the gate electrode, and the etching selectivity of gate polysilicon to underlying gate oxide film. Specifically, for achieving the verticality of the side walls, etching conditions with scarce adhesive products should be used. For achieving high selectivity to the underlying oxide film, etching conditions with plentiful adhesive products should be used. When there are two conflicting conditions as mentioned, the processing conditions are difficult to control. FIGS. 8 to 10 are diagrams for explaining processing conditions for satisfying such conflicting requirements. Assuming that an aging change of a processing apparatus 1 results in a degraded verticality of the side walls, even if a reduction in a processing condition 1 (here, a flow rate of a gas A), for example, improves the verticality, this reduction simultaneously causes lower selectivity to the underlying oxide film, so that this is not preferable as a processing condition.

It is therefore necessary to find a combination of the processing condition 1 and a processing condition 2 (here, wafer bias power) to improve the verticality of the side walls while preventing the selectivity to the underlying oxide film from degrading.

To solve this problem, as shown in FIG. 8, experimental conditions with different processing conditions are set at several to several tens of points around a central condition under which the processing is normally performed, and the processing is performed under these experimental conditions to measure processing results. Points 1–4 in FIG. 10 correspond to the experimental conditions 1–4 in FIG. 8. Assume herein that measured values for the verticality of the side walls are taken as processing result measured values A, and an underlying oxide film selection ratio is taken as processing result measured values B.

As illustrated in FIG. 9, the PLS method is applied to this experiment, using a correlation of two processing conditions to two processing result measured values, to derive a direction A in which the conditions have the highest correlation to the verticality of the side walls, as shown in FIG. 10. A direction B orthogonal to the direction A, in which the conditions have the highest correlation to the selectivity to the underlying oxide film is calculated from the direction in which the conditions have the highest correlation to the selectivity to the underlying oxide film and which is derived by the PLS method like the above. These condition direction A and condition direction B have been set in the process recipe control unit 10 in FIG. 1A. With these conditions set beforehand, when deteriorated verticality of the side walls is predicted in the prediction unit 9 based on the model equation, the processing condition may be modified in the condition direction A to improve the verticality of the side walls without scarifying the underlying oxide film selection ratio. The calculated condition control directions are preserved in a process recipe control direction storage unit 14 for use in modifying associated processing conditions when predicted values for processing results calculated by the model equation deviate from set values.

While the example described herein modifies two processing conditions, the PLS method can modify a larger number of processing conditions. As more processing conditions are modified, more preferable results can be provided. Also, conflicting processing result measured values are not limited to two, but a larger number of processing results can be taken into account. For example, in addition to the verticality of the side walls and the selection ratio to the underlying oxide film, a mask selection ratio or the like may be employed.

Figure 2:
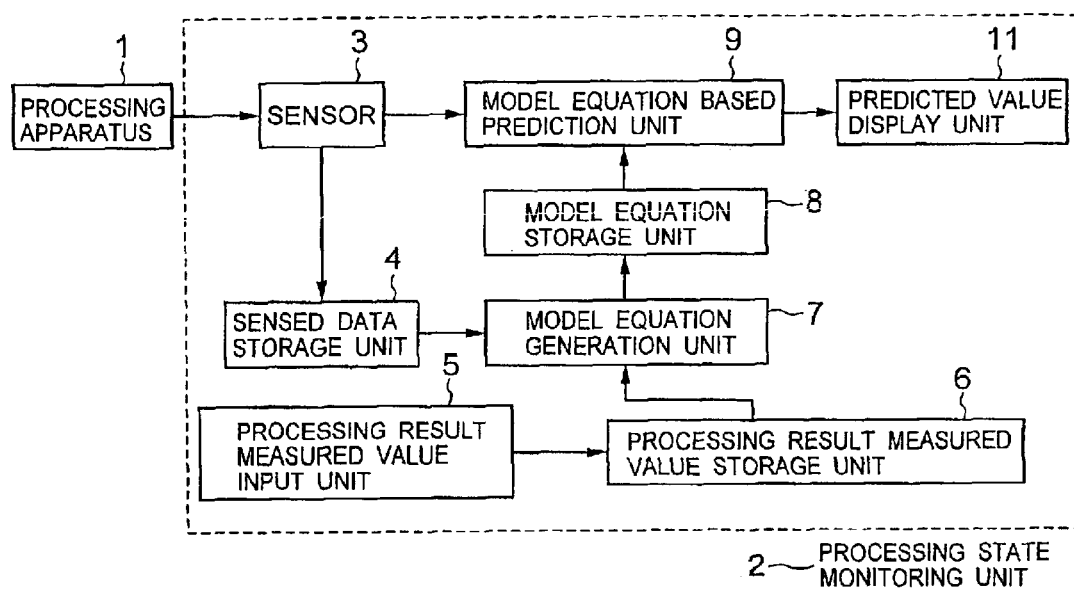
FIG. 2 is a block diagram illustrating another embodiment of a processing state monitoring unit in FIG. 1.

FIG. 2 illustrates another embodiment of the present invention. While the system of FIG. 2 is substantially identical in configuration to the system of FIG. 2, the former differs from the latter in that a predicted value display unit 11 is provided instead of the process recipe control unit 10 to display a message for notifying a fault on a display of the apparatus or the like. The display unit 11 may be implemented by a buzzer for generating an alarm, posting an email, and so on.

Figure 3:
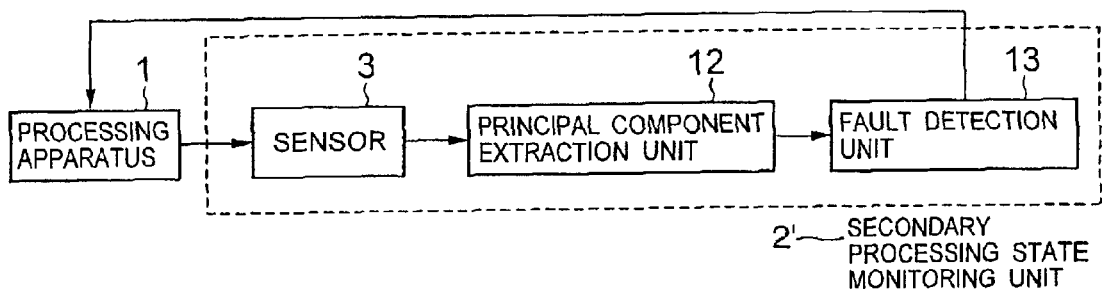
FIG. 3 is a block diagram illustrating an embodiment of secondary processing state monitoring unit.

FIG. 3 illustrates a further embodiment of the present invention. The systems so far described above rely on the prediction of processing results using a model equation, so that they cannot monitor the processing of a device for which no model equation has been generated. Measurements of processing results often take a very long time, so that measurements may be hardly made on all of the processing results. Thus, the model equation cannot be generated for such a device. To address this problem, a principal component extraction unit 12 extracts principal components from a variety of types of sensed data, and a fault monitoring unit 13 monitors variations in the principal components to detect a fault in the processing, as illustrated in FIG. 3. If a fault is detected, the apparatus should stop the processing of the next wafer. The fault may be detected using, for example, a variation management method called "SPC" (Statistical Process Control). To implement this method, averages and variances of principal components during the processing of an intended device are stored to determine that the processing is faulty if a measured principal component deviates from its average by several times as much as its variance.

Figure 4:
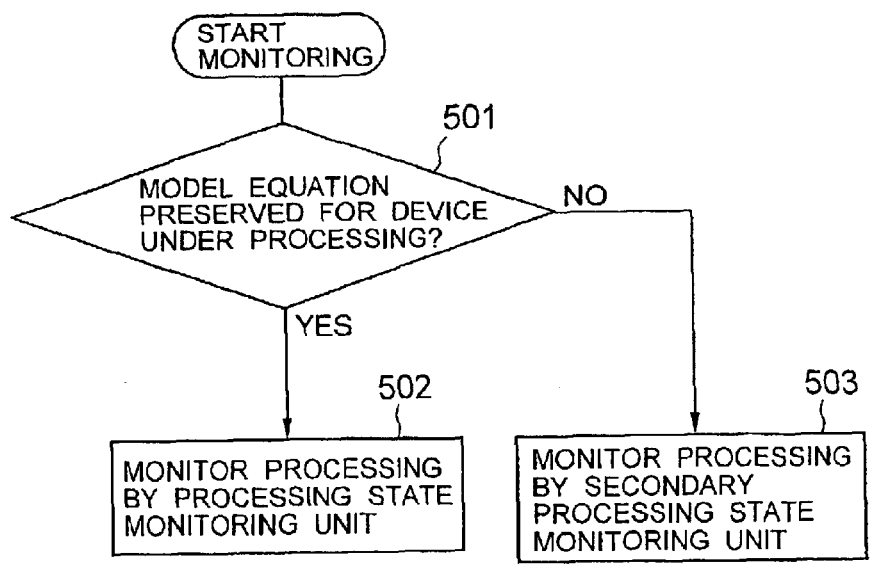
FIG. 4 is a flow chart illustrating an exemplary method of monitoring a processing state of a device.

FIG. 4 is a flow chart for explaining a processing flow suitable for a processing apparatus which comprises the processing state monitoring unit 2 and a secondary processing state monitoring unit 2'. It is first determined whether or not a model equation has been generated and preserved for a device intended for processing (step 501). When the model equation has been preserved, the processing state monitoring unit 2 executes monitoring control (step 502). When no model equation has been preserved, the secondary processing state monitoring unit 2' executes the monitoring control (step 503).

The provision of the secondary processing state monitoring unit 2' using only principal components as in FIG. 3 as well as the processing state monitoring unit 2 using the model equation as in FIGS. 1A and 2 will permit the monitoring of processing states of either of a device for which a model equation has been generated and preserved as illustrated in FIG. 4 and a device for which no model equation has been generated. Such a monitoring system having flexibility is preferred for monitoring a semiconductor processing apparatus.

What is claimed is:

1. A semiconductor plasma processing apparatus for processing a semiconductor wafer, comprising:

a sensor for monitoring at least one processing state of said semiconductor plasma processing apparatus;

first and second processing state monitoring units coupled to said sensor; and a selector unit for selecting one of said first and second processing state monitoring units;

wherein said first processing state monitoring unit includes:

processing result input means for inputting externally measured values for processing results of a semiconductor wafer processed by said semiconductor processing apparatus in a pre-trial;

a model equation generation unit which generates a model equation for predicting a processing result using sensed data acquired by said sensor as an explanatory variable, based on said sensed data and said externally measured values;

a processing result prediction unit for predicting a processing result based on said model equation and said sensed data; and a process recipe control unit for comparing said predicted processing result with a pre-set value to control a processing condition of said semiconductor plasma processing apparatus such that a deviation between said predicted processing result and said pre-set value is corrected; and wherein said second processing state monitoring includes:

a principal component extraction unit for extracting a principal component based on sensed data acquired by said sensor; and a fault detection unit for detecting a fault in processing based on variations in the principal component extracted by said extraction unit.

2. A semiconductor plasma processing apparatus according to claim 1, wherein said principal component extraction unit extracts the principal component from a variety of types of sensed data acquired by said sensor.

3. A semiconductor plasma processing apparatus according to claim 1, wherein said selection unit selects said second processing state monitoring unit in response to a determination of no model equation preserved for the semiconductor wafer which is being processed.

* * * * *